(12) United States Patent
Mori et al.

(10) Patent No.: US 7,387,977 B2
(45) Date of Patent: *Jun. 17, 2008

(54) ALUMINA-SINTERED BODY AND ASSOCIATED MANUFACTURING METHOD, AND ELECTROSTATIC CHUCK AND ASSOCIATED MANUFACTURING METHOD

(75) Inventors: Yutaka Mori, Nagoya (JP); Hiroto Matsuda, Ogaki (JP); Kazuhiro Nobori, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 157 days.

This patent is subject to a terminal disclaimer.

(21) Appl. No.: 11/370,662

(22) Filed: Mar. 8, 2006

(65) Prior Publication Data

US 2006/0205585 A1    Sep. 14, 2006

(30) Foreign Application Priority Data

Mar. 11, 2005   (JP)   ............................. 2005-069689

(51) Int. Cl.
  *C04B 35/10* (2006.01)
(52) U.S. Cl. ...................... 501/127; 501/100; 501/153; 279/128
(58) Field of Classification Search ................ 501/100, 501/127, 153; 279/128
  See application file for complete search history.

(56) References Cited

U.S. PATENT DOCUMENTS

| 3,871,891 | A |  | 3/1975 | Schuller et al. |
| 5,242,298 | A |  | 9/1993 | Sernetz |
| 6,143,678 | A |  | 11/2000 | Yamamoto et al. |
| 6,383,963 | B1 |  | 5/2002 | Yamamoto et al. |
| 6,486,085 | B1 | * | 11/2002 | Katsuda et al. ............ 501/98.4 |
| 6,648,638 | B2 | * | 11/2003 | Castro et al. ................... 433/8 |
| 6,858,173 | B2 | * | 2/2005 | Zhan et al. ................. 264/430 |
| 6,875,374 | B1 | * | 4/2005 | Zhan et al. ................. 252/502 |
| 2003/0165790 | A1 |  | 9/2003 | Castro et al. |
| 2006/0169688 | A1 | * | 8/2006 | Mori et al. ............. 219/444.1 |

FOREIGN PATENT DOCUMENTS

| EP | 1 602 635 | 12/2005 |
| JP | 03-115162 A1 | 5/1991 |
| JP | 11-071168 A1 | 3/1999 |
| JP | 2000-154053 A1 | 6/2000 |
| JP | 2000-219569 A1 | 8/2000 |
| JP | 2004-018296 A1 | 1/2004 |

* cited by examiner

*Primary Examiner*—Karl E Group
(74) *Attorney, Agent, or Firm*—Burr & Brown

(57) ABSTRACT

A binder is mixed to alumina powder with a purity of 99.5% or more (step S11), the mixture is granulated (step S12), resultant granule powder is formed with a die (step S13), and a formed compact is sintered in a hot-pressing manner (step S14).

9 Claims, 5 Drawing Sheets

FIG. 4A
FIG. 4B
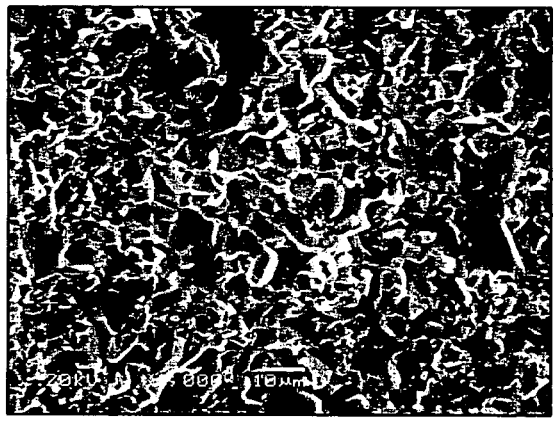
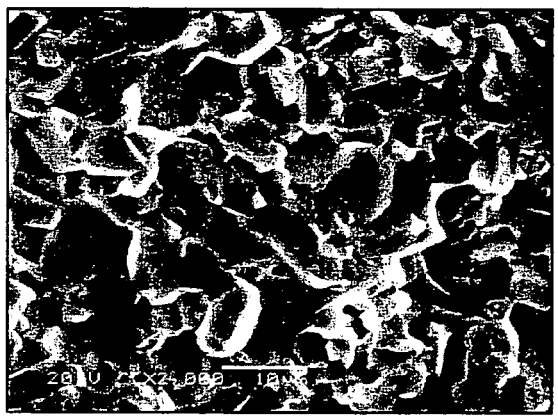

ALUMINA-SINTERED BODY AND ASSOCIATED MANUFACTURING METHOD, AND ELECTROSTATIC CHUCK AND ASSOCIATED MANUFACTURING METHOD

CROSS REFERENCE TO RELATED APPLICATIONS

This application is based upon and claims the benefit of priority from prior Japanese Patent Application No. 2005-069689, filed on Mar. 11, 2005; the entire contents of which are incorporated herein by reference.

BACKGROUND OF THE INVENTION

1. Field of the Invention

The present invention relates to an alumina-sintered body, and an associated manufacturing method, as well as to an electrostatic chuck, and an associated manufacturing method, and in particular, to an alumina-sintered body suitable for use in an electrostatic chuck applicable to a semiconductor manufacturing apparatus, and a manufacturing method of the alumina-sintered body, as well as to an electrostatic chuck using the alumina-sintered body, and a manufacturing method associated therewith.

2. Description of the Related Art

In Japanese Patent No. 2759288, needle-like aluminum borate is added to alumina powder, and a resultant mixture is sintered to obtain a sintered body with high toughness.

In Japanese Patent Application Laid-Open Publication No. 11-71168, an oxide of a metal of VA family and $SiO_2$ are added to the mixture, and a resultant mixture is sintered to obtain a sintered body with high strength and toughness due to occurrences of anisotropic growth in alumina crystal particles.

In Japanese Patent Application Laid-Open Publication No. 2000-219569, an oxide of a VA family metal and $SiO_2$ are added to low-purity alumina after an acid cleaning process, and a resultant mixture is sintered at temperatures within 1320 to 1600° C. to obtain a sintered body with high strength and toughness due to occurrences of anisotropic growth in alumina crystal particles.

In Japanese Patent Application Laid-Open Publication No. 2000-154053, an aluminum material containing impurities, such as silicon oxide and calcium oxide, and easily sinterable for high densification at low sintering temperature is used as a raw material, which is calcined within 1000 to 1300° C., and then sintered within 1100 to 1500° C. under unidirectional pressures for deformation, to obtain a sintered body with high strength and toughness.

In Japanese Patent Application Laid-Open Publication No. 2004-18296, a sintered body containing 0.1 to 1.0% by weight of titanium oxide and 1.2% or less by weight of carbon, the rest being substantially composed of alumina, can exhibit a low volume resistivity within $10^0$ to $10^8 \Omega \cdot cm$ without degradation in characteristic of alumina.

SUMMARY OF THE INVENTION

By techniques described in those literatures, sintered bodies are obtainable with high strength or with low volume resistivity within $10^0$ to $10^8 \Omega \cdot cm$. However, such conventional technique are unable to meet requirements of use for an electrostatic chuck to be applied to a semiconductor manufacturing apparatus, which needs a metal contamination-less condition, or for an electrostatic chuck of a Coulomb's force type, which needs a volume resistivity of $10^{15} \Omega \cdot cm$ or more.

The present invention has been made in view of such points. It therefore is an object of the invention to provide an alumina-sintered body, and a manufacturing method thereof, as well as an electrostatic chuck, and a manufacturing method thereof, meeting the requirements of high strength, metal contamination-less condition, and volume resistivity of $10^{15} \Omega \cdot cm$ or more.

(1) To achieve the object, according to an aspect of the invention, an alumina-sintered body is obtained by mixing a binder to alumina powder with a purity of 99.5% or more to prepare granulated powder, forming a compact of the granulated powder with a metallic die, and performing a hot-press sintering of the compact, whereby the alumina-sintered body contains 0.05% to 0.5% by weight residual carbon, and has a four-point bending strength of 500 MPa or more.

Preferably, the size of crystal grains in the alumina sintered body is 1 to 3 μm. By setting the grain size in this range, the strength of the alumina sintered body can be increased.

(2) An electrostatic chuck according to the present invention includes a first alumina sintered body; an electrode formed on an outer surface of the first alumina sintered body by screen printing; and a second alumina sintered body formed on the electrode and the outer surface with the electrode formed thereon by hot-press sintering of alumina granulated powder obtained by mixing alumina powder and a binder, the second alumina sintered body covering the electrode and having the electrode embedded therein. The first alumina sintered body is the alumina sintered body described in (1).

According to this aspect, there can be obtained an alumina-sintered body meeting requirements of high strength, metal contamination-less condition, and volume resistivity of $10^{15} \Omega \cdot cm$ or more.

BRIEF DESCRIPTION OF THE ACOMPANYING DRAWINGS

The above and further objects, novel features, and advantages of the present invention will more fully appear from the following detailed description of the preferred embodiments when the same is read in conjunction with the accompanying drawings, in which:

FIG. 4A and FIG. 4B are photographs of SEM by magnifications of 1000 and 2000, respectively, of a surface of a sintered body according to a Comparative Example 2 of the embodiment of the invention.

DETAILED DESCRIPTION OF THE PREFERRED EMBODIMENTS

There will be detailed the preferred embodiments of the present invention, with reference to the accompanying drawings.

Figure 1A:
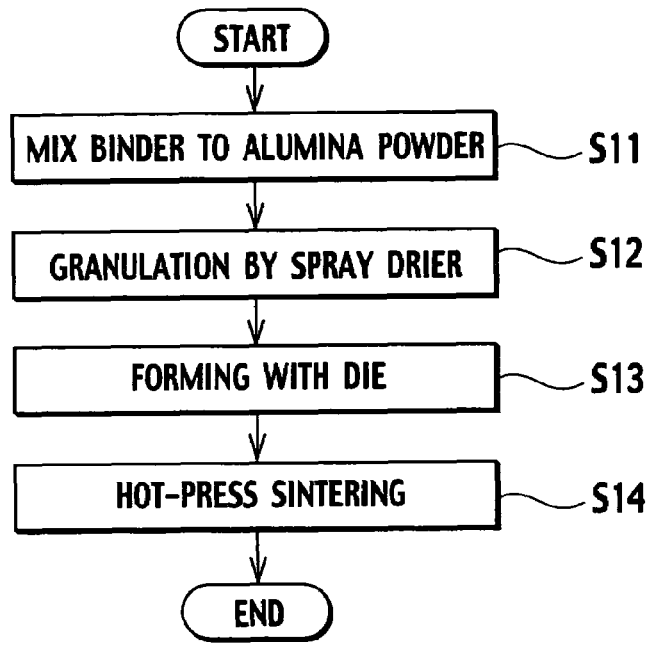
FIG. 1A is a flowchart of steps of a manufacturing method of alumina-sintered body according to an embodiment of the present invention.

FIG. 1A is a flowchart of four steps S11 to S14 of a manufacturing method of alumina-sintered body according to an embodiment of the invention.

First, a binder is mixed to powder of an alumina material, for preparation of a raw material (step S11). Then, the raw material is granulated by using a spray dryer (step S12), and a capacity of resultant granule is formed into a compact by using a metallic die (step S13). Thereafter, the compact is sintered in a hot-pressing manner to obtain an alumina-sintered body (step s14)

<Granulation>

More specifically, at the step S1, the alumina material is mixed with the binder and a solvent, for a prescribed interval of time, to obtain a mixture in the form of slurry. Then, at the step S12, the mixture is screened, to be dried for the granulation. The alumina material is powder of a purity of 99.5% or more. Preferably, average grain size of this alumina powder is 1 to 3 μm.

The binder may be polyvinyl alcohol (PVA) or stearic acid. The amount of the added binder may preferably range within 1.5% to 13% by weight, in consideration of a commensurate content of carbon to be residual in the alumina sintered body.

For the screening, a screen of a rotary type, such as a trommel, may well be used. The mixing time may be within one to three hours. For a facilitated transfer into the screen, such as a trommel, as well as for a smooth screening, the mixture of alumina material and binder is dissolved in the solvent in advance.

For granulation of the solution into powder, the spray drier (SD) to be used may preferably be either an atomizing type or a centrifugal type that is adapted for an instantaneously drying of the mixture from the slurry state into a granulation state. Grain size of the granulated powder to be obtained should be within a range of approximately 70 to 130 micrometers in average.

<Sintering>

At the step S13, an adequate capacity of granule of alumina material containing the binder is formed into the form of a plate, as a compact shaped by a die therefore. Then, at the step S14, the plate is sintered in a hot pressing manner under the following sintering condition.

That is, the sintering temperature is controlled first to rise at a rate within 100 to 700° C./hr over a temperature range from a normal temperature to about 1100° C., and then, to rise at a rate within 30 to 150° C./hr up to an adequate temperature within a range of approximately 1400 to 1600° C., before a sintering to be performed within a temperature range of approximately 1400 to 1700° C., for an adequate interval of time within one to four hours, in a nitrogen atmosphere.

After the sintering, the temperature is controlled to fall at a rate within 100 to 300° C./hr, to a temperature within a range of 1000 to 1400° C., where the alumina-sintered body is released from a pressing pressure that has been exerted thereon till then within a pressure range of 100 to 200 kg/cm$^2$.

EXAMPLES

Example 1

The following alumina material and binder were mixed, together with a solvent, for two hours in a trommel, and the mixture was screened, to be dried by a spray dryer for granulation to obtain granulated powder of an average grain size of 100 μm.

Alumina material: alumina powder of an alumina purity of 99.5% and an average grain size of 1 μm.

Binder: 3% by weight of PVA

Figure 1B:
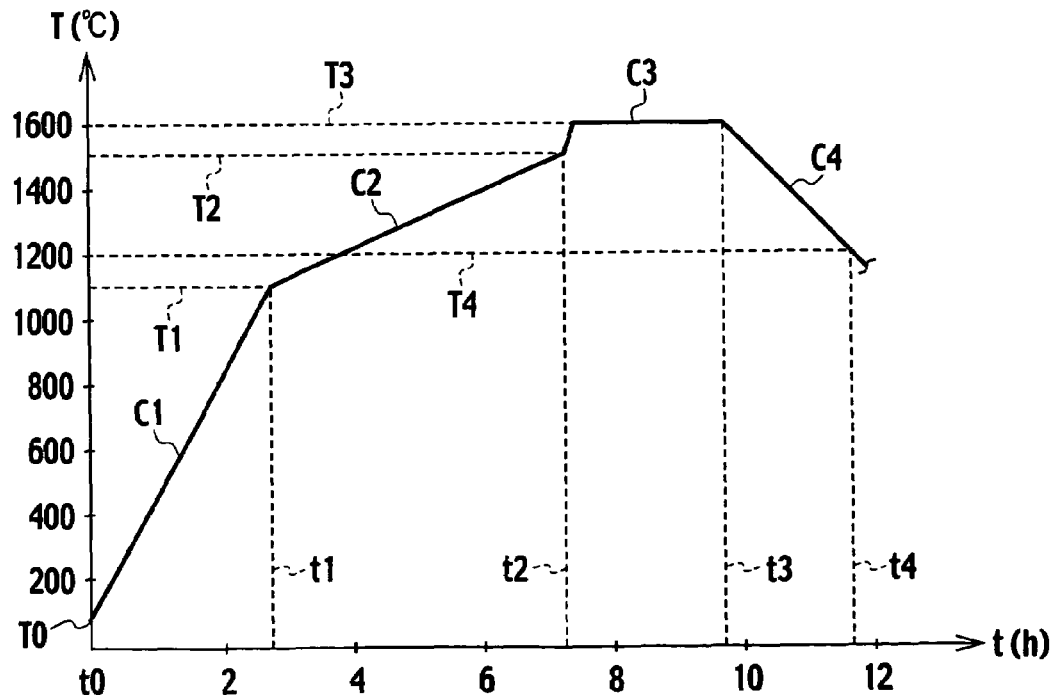
FIG. 1B is a time chart of a hot-press sintering in the manufacturing method of FIG. 1A.

The granulated powder was formed, using a die, in the form of a plate, and this work was sintered to an alumina-sintered body of a size of 340 mm diameter by 5 mm thickness, by a process illustrated in FIG. 1B.

FIG. 1B is a time chart of a hot-press sintering that corresponds to the step S14 in the manufacturing method of FIG. 1A.

As shown in FIG. 1B, the sintering temperature T was raised at a rate of 400° C./hr, for a required time interval from an initial time t0 to a prescribed time t1, along a curve C1over a temperature range from a normal temperature T0 to a higher temperature T1 (=1100° C.), and further at a rate of 90° C./hr, for a required time interval from the time t1 to another prescribed time t2, along a curve C2 over a temperature range from the temperature T1 (=1100° C.) to a yet higher temperature T2 (=1500° C.), before entering a sintering to be performed along a curve C3 at a highest temperature T3 (=1600° C.), for a required time interval up to another prescribed time t3. After this sintering, the temperature T was lowered at a rate of 200° C./hr, for a required time interval from the time t3 to another prescribed time t4, along a curve C4 over a temperature range from the temperature T3 (=1600° C.) to a lower temperature T4 (=1400° C.).

During the process in which the temperature T was varied from T0 to T4, via T3, the work being sintered was pressed with a pressure exerted thereon, which was controlled to 100 kg/cm$^2$ at the highest temperature T3. When the temperature T4 was reached, the sintered work was released from exertion of the pressure.

In Example 1, the alumina-sintered body thus obtained had characteristics listed in Table 1. As shown in Table 1, the crystal grain size was 1.5 μm in average, four-point bending strength was 550 MPa with a σ(standard deviation) of 29 MPa, and residual carbon content was 0.14% by weight.

Table 2 shows a volume resistivity of the alumina-sintered body of Example 1, that was 2×10$^{17}$Ω·cm.

For measurement of the average crystal grain size, an SEM (JSM900LV manufactured by NIPPON DENSHI) was used. For the four-point bending strength, a room-temperature four-point bending strength was measured to JISR1601. The density was measured by an Archimedes method employing pure water as the medium. An ICP (SPQ9000 manufactured by SEIKO INSTRUMENT CO., LTD) was employed to measure Si, Fe, Ca and Mg contents. For C content, measurement was made by a high-frequency induction heating infrared radiation absorption method.

The volume resistivity was measured at 23° C. in an atmospheric atmosphere by a method based on JIS C2141, where a voltage of 1000V/mm was applied, and a current at 30 min. after the voltage application was read for calculation of volume resistivity therefrom.

Figure 2A:
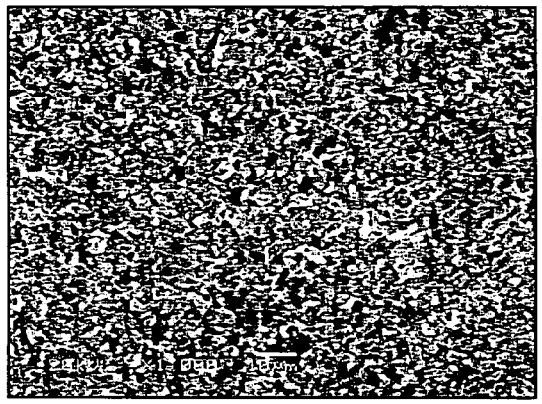
FIG. 2A and FIG. 2B are photographs of SEM (Scanning Electron Microscopy) by magnifications of 1000 and 2000, respectively, of a surface of a sintered body according to an Example 1 of the embodiment of the invention.
Figure 2B:
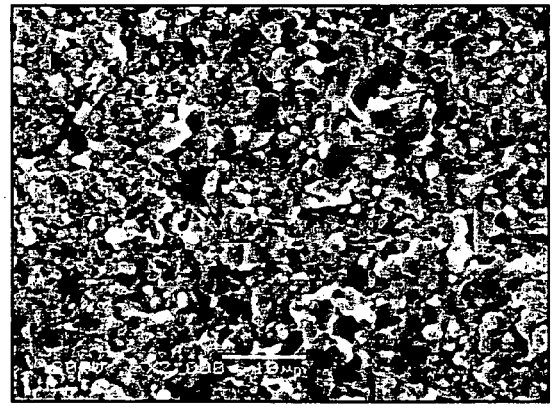

FIG. 2A and FIG. 2B show SEM photographs of a surface of the sintered body of Example 1, taken by magnifications of 1000 and 2000, respectively.

Comparative Example 1

An alumina-sintered body was manufactured in like manner to Example 1, subject to mixing no binder.

The alumina-sintered body had characteristics listed in Table 1. As shown in Table 1, the crystal grain size was 3.8 μm in average, four-point bending strength was 420 MPa (σ: 15) and residual carbon content was less than 0.01% by weight.

Figure 3A:
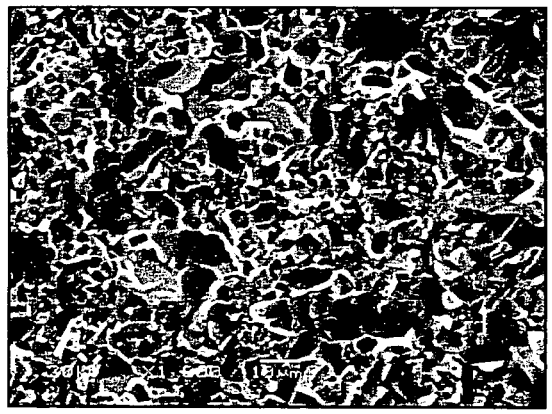
FIG. 3A and FIG. 3B are photographs of SEM by magnifications of 1000 and 2000, respectively, of a surface of a sintered body according to a Comparative Example 1 of the embodiment of the invention.
Figure 3B:

FIG. 3A and FIG. 3B are SEM photographs of a surface of the sintered body of Comparative Example 1, taken by magnifications of 1000 and 2000, respectively.

Comparative Example 2

An alumina-sintered body was manufactured in like manner to Example 1, subject to mixing no binder by pressureless sintering.

The alumina-sintered body had characteristics listed in Table 1. As shown in Table 1, the crystal grain size was 7.5 μm in average, four-point bending strength was 310 MPa (σ: 20), and residual carbon content was less than 0.01% by weight.

FIG. 4A and FIG. 4B are SEM photographs of a surface of the sintered body of Comparative Example 2, taken by magnifications of 1000 and 2000, respectively.

TABLE 1

|  | Example 1 | Comparative Example 1 | Comparative Example 2 |
| --- | --- | --- | --- |
| Sintering method | Hot-Press | Hot-Press | Pressureless |
| Binder | 3 wt % PVA | — | — |
| Average crystal grain size of sintered body [μm] | 1.5 | 3.8 | 7.5 |
| Four-point bending strength of sintered body [MPa] | 550 (σ: 29) | 420 (σ: 15) | 310 (σ: 20) |
| Density [g/cm$^3$] | 3.92 | 3.94 | 3.9 |
| Chemical analysis of sintered body |  |  |  |
| Si [ppm] | 733 | 698 | 749 |
| Fe [ppm] | 84 | 79 | 90 |
| Ca [ppm] | 311 | 307 | 321 |
| Mg [ppm] | 537 | 529 | 552 |
| C [% by weight] | 0.14 | <0.01 | <0.01 |

As shown in Table 1, the Comparative Example 2, of which the sintering was performed by pressureless sintering, with no binder mixed, exhibited a four-point bending strength of 310 MPa, while the Comparative Example 1, of which the sintering was performed under a high pressure at a high temperature, with no binder mixed, exhibited a four-point bending strength of 420 MPa. In contrast, the Example 1, of which the sintering was performed under a high pressure at a high temperature, with mixed binder, exhibited a four-point bending strength of 550 MPa. In both Comparative Examples 1 and 2, the content of residual carbon was less than 0.01% by weight, while that of Example 1 was 0.14% by weight, which means the Example 1 had an increased strength due to the presence of carbon that had been contained in the mixed binder and survived to be residual in the sintered body.

TABLE 2

|  | Comp. Example 3 | Example 2 | Example 1 | Example 3 | Comp. Example 4 |
| --- | --- | --- | --- | --- | --- |
| Sintering method | Hot-Press | Hot-Press | Hot-Press | Hot-Press | Hot-Press |
| Binder (wt. %) | 0.7% | 1.1% | 3% | 11% | 13% |
| Four-Point bending strength [MPa] | 481 (σ: 15) | 519 (σ: 18) | 550 (σ: 29) | 592 (σ: 20) | 310 (σ: 20) |
| Density [g/cm$^3$] | 3.92 | 3.92 | 3.92 | 3.92 | 3.91 |
| Volume resistivity [Ω · cm] | 6E+17 | 4E+17 | 2E+17 | 5E+15 | 8E+14 |
| Chemical analysis |  |  |  |  |  |
| Si [ppm] | 720 | 722 | 733 | 705 | 741 |
| Fe [ppm] | 87 | 89 | 84 | 80 | 85 |
| Ca [ppm] | 315 | 309 | 311 | 322 | 321 |
| Mg [ppm] | 522 | 521 | 537 | 529 | 519 |
| C [% by weight] | 0.03 | 0.05 | 0.14 | 0.5 | 0.6 |

Example 2

An alumina-sintered body was manufactured in like manner to the Example 1, subject a changed constitution and quantity of binder mixed. The content of residual carbon was 0.05% by weight, and four-point bending strength was 519 MPa (σ: 18). The amount of binder added was 1.1 wt % at this time.

Example 3

An alumina-sintered body was manufactured in like manner to the Example 1, subject a changed constitution and quantity of binder mixed. The content of residual carbon was 0.5% by weight, and four-point bending strength was 592 MPa (σ: 20). The amount of binder added was 11 wt % at this time.

Comparative Example 3

An alumina-sintered body was manufactured in like manner to the Example 1, subject a changed constitution and quantity of binder mixed. The content of residual carbon was 0.03% by weight, and four-point bending strength was 481 MPa (σ: 15). The amount of binder added was 0.7 wt % at this time.

Comparative Example 4

An alumina-sintered body was manufactured in like manner to the Example 1, subject a changed constitution and quantity of binder mixed. The content of residual carbon was 0.6% by weight, and four-point bending strength was 310 MPa (σ: 20). The amount of binder added was 13 wt % at this time.

As is apparent from Table 2 listing Examples 1 to 3 and Comparative Examples 3 and 4, the four-point bending strength ranged within 500 to 600 MPa for residual carbon contents within a range of 0.05 to 0.5% by weight.

When the amount of residual carbon increased to 0.6 wt %, the four-point flexural strength was reduced to less than 500 MPa. This is considered to be because when about 13 wt % of the binder, which was an excessive amount, was mixed, the amount of residual carbon increased to 0.6 wt % to reduce the density at forming.

Moreover, when the amount of residual carbon was 0.6 wt %, the volume resistivity was less than E+15Ω·cm. This is considered to be because the amount of remaining carbon increased to 0.6 wt %, which was excessive, and an amount of remaining carbon diffused was excessively increased accordingly.

Since the remaining carbon has an effect on suppressing growth of the alumina crystal grains, as shown in Table 1 and FIGS. 2 to 4, as the amount of remaining carbon increases, the size of the crystal grains in the alumina sintered body is reduced.

The ceramics has a maximum crack length proportional to the grain size, and has a greater strength with a smaller grain size. Further, the strength is controlled by inter-granule contact areas, and becomes higher, as they increase with smaller granules.

As for internal stresses, crystals have their coefficients of thermal expansion different depending on their axes, forming distorted granules, with great tensile stresses developed at boundaries. Such internal tensile stresses have commensurate additive effects, resulting in an earlier arrival to a breakdown stress, and the strength becomes higher with smaller granules, as the stress is larger with greater grain sizes.

As in Tables 1 and 2, the content of Fe (iron) was within a range of 80 to 89 ppm, and that of Mg (magnesium) was within a range of 521 to 537 ppm. Further, as in Table 2, the volume resistivity was within a range of 5E+15 to 4E+17.

From such points, it is assumed that a suppressed grain size growth of residual carbon rendered the grain size smaller, resulting in an increased strength, with a necessity of controlling the amount of residual carbon which, if excessive, might have caused a decreased volume resistivity.

Figure 5:
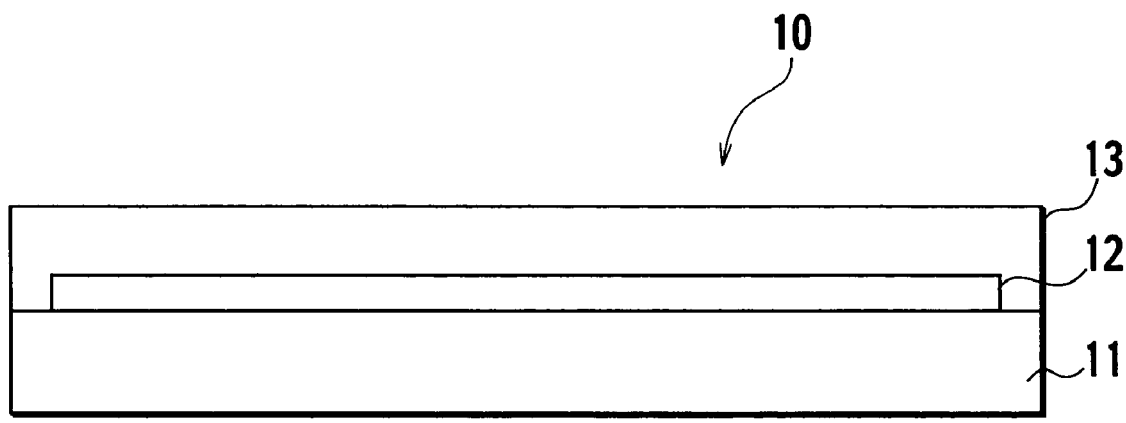
FIG. 5 is a side view of an electrostatic chuck according to an embodiment of the invention.

FIG. 5 shows a side view of an electrostatic chuck 10 according to an embodiment of the invention. The electrostatic chuck 10 is configured with a first alumina-sintered body 11, an electrode 12, and a second alumina-sintered body 13. Hereinafter, a brief description is given of a manufacturing method of the electrostatic chuck 10.

First, the first alumina sintered body 11 was produced by the same method as that of Examples 1 to 3 described above.

Next, the electrode 12 was formed on a predetermined outer surface of the first alumina sintered body 11 by screen printing.

Subsequently, the second alumina sintered body 13 was formed on the electrode 12 and the predetermined outer surface of the first alumina sintered body 11 with the electrode 12 printed thereon. Specifically, the second alumina sintered body 13 was formed by hot-press sintering of alumina granulated powder obtained by mixing the alumina material and binder so that the electrode 12 was covered with and embedded in the second alumina sintered body 13.

Since the first alumina sintered body 11 was produced in the same method as that of Examples 1 to 3 described above, the first alumina sintered body 11 includes properties (for example, the four-point flexural strength, density, and the like shown in Tables 1 and 2) equal to those of the alumina sintered bodies of Examples 1 to 3.

Moreover, the electrostatic chuck produced by this method includes high resistivity and high strength. Accordingly, it is possible to reduce leak current generated when high voltage is applied to the electrode 12. Furthermore, the electrostatic chuck thus produced has enough strength to electrical stress generated when high voltage is applied and serves as an electrostatic chuck over a long period of time.

While preferred embodiments of the present invention have been described using specific terms, such description is for illustrative purposes, and it is to be understood that changes and variations may be made without departing from the spirit or scope of the following claims.

What is claimed is:

1. An alumina-sintered body obtained by mixing a binder to alumina powder with a purity of 99.5% or more to prepare granulated powder, forming a compact of the granulated powder with a metallic die, and performing a hot-press sintering of the compact, whereby the alumina-sintered body contains 0.05% to 0.5% by weight residual carbon, and has a four-point bending strength of 500 MPa or more.

2. The alumina-sintered body as claimed in claim 1, having a volume resistivity of $10^{15}\Omega\cdot$cm or more.

3. The alumina-sintered body as claimed in claim 1, wherein the granulated powder is prepared by a spray drying method.

4. The alumina sintered body as claimed in claim 1, wherein size of crystal grains in the alumina sintered body is 1 to 3 μm.

5. An electrostatic chuck, comprising:
a first alumina sintered body;
an electrode formed on an outer surface of the first alumina sintered body by screen printing; and
a second alumina sintered body formed on the electrode and the outer surface with the electrode formed thereon by hot-press sintering of alumina granulated powder obtained by mixing alumina powder and a binder, the second alumina sintered body covering the electrode and having the electrode embedded therein, wherein the first alumina sintered body is the alumina sintered body as claimed in claim 1.

6. The alumina-sintered body as claimed in claim 1, wherein said binder is polyvinyl alcohol and is present in an amount of 1.1% to 11.0% by weight.

7. The alumina-sintered body as claimed in claim 1,wherein the average grain size of said granulated powder is within a range of 70 μm to 130 μm.

8. The electrostatic chuck of claim 5, wherein said binder is polyvinyl alcohol and is present in an amount of 1.1% to 11.0% by weight.

9. The electrostatic chuck of claim 5, wherein the average grain size of said granulated powder is within a range of 70 μm to 130 μm.

* * * * *